US012652799B2

(12) United States Patent
Chuang

(10) Patent No.: US 12,652,799 B2
(45) Date of Patent: Jun. 9, 2026

(54) SEMICONDUCTOR STRUCTURE AND METHOD OF MANUFACTURING THE SAME

(71) Applicant: NANYA TECHNOLOGY CORPORATION, New Taipei City (TW)

(72) Inventor: Ying-Cheng Chuang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 370 days.

(21) Appl. No.: 18/382,669

(22) Filed: Oct. 23, 2023

(65) Prior Publication Data

US 2025/0016998 A1     Jan. 9, 2025

Related U.S. Application Data

(62) Division of application No. 18/218,215, filed on Jul. 5, 2023.

(51) Int. Cl.
*H10B 12/00*          (2023.01)

(52) U.S. Cl.
CPC ............. *H10B 12/50* (2023.02); *H10B 12/09* (2023.02)

(58) Field of Classification Search
CPC .... H10B 12/053; H10B 12/09; H10B 12/488; H10B 12/50
See application file for complete search history.

(56) References Cited

U.S. PATENT DOCUMENTS

| | | | |
|---|---|---|---|
| 2004/0195608 A1 | 10/2004 | Kim et al. | |
| 2007/0059871 A1 | 3/2007 | Yamazaki | |
| 2007/0096204 A1 | 5/2007 | Shiratake | |
| 2008/0084731 A1 | 4/2008 | Lee et al. | |
| 2021/0351189 A1* | 11/2021 | Luo ...................... | H10D 30/668 |
| 2023/0005946 A1 | 1/2023 | Shi et al. | |
| 2023/0369370 A1* | 11/2023 | Chen .................. | H10F 39/8063 |

(Continued)

FOREIGN PATENT DOCUMENTS

| | | | | |
|---|---|---|---|---|
| CN | 113471200 A | 10/2021 | | |
| KR | 20130100661 A | * 9/2013 | ............. | H10F 39/18 |
| TW | 200733306 A | 9/2007 | | |

(Continued)

OTHER PUBLICATIONS

Office Action and and the search report mailed on Aug. 30, 2024 related to Taiwanese Application No. 112127918.

(Continued)

*Primary Examiner* — Edward Chin
(74) *Attorney, Agent, or Firm* — Xuan Zhang

(57) ABSTRACT

A semiconductor structure and a method of manufacturing the same are provided. The semiconductor structure includes a device and at least one recess transistor. The device includes a substrate and a plurality of word lines. The substrate includes an array portion and a periphery portion surrounding the array portion. The plurality of word lines are disposed in the array portion. The periphery portion is free of word lines. The periphery portion of the substrate defines at least one recess. The at least one recess transistor is disposed in the at least one recess of the periphery portion of the substrate.

7 Claims, 16 Drawing Sheets

(56) References Cited

U.S. PATENT DOCUMENTS

2024/0120358 A1* 4/2024 Banerjee ................ G02B 1/118

FOREIGN PATENT DOCUMENTS

| | | |
|---|---|---|
| TW | 202131413 A | 8/2021 |
| TW | 202303942 A | 1/2023 |

OTHER PUBLICATIONS

Office Action and and the search report mailed on Aug. 19, 2024 related to Taiwanese Application No. 113112273.
Office Action and and the search report mailed on Dec. 23, 2025 related to U.S. Appl. No. 18/218,215, wherein this application is a DIV of U.S. Appl. No. 18/218,215.

* cited by examiner

1

SEMICONDUCTOR STRUCTURE AND METHOD OF MANUFACTURING THE SAME

CROSS-REFERENCE TO RELATED APPLICATION

This application is a divisional application of U.S. Non-Provisional application Ser. No. 18/218,215 filed Jul. 5, 2023, which is incorporated herein by reference in its entirety.

TECHNICAL FIELD

The present disclosure relates to a semiconductor structure and a method of manufacturing the same, and more particularly, to a semiconductor structure including recess transistor, and a method of manufacturing the same.

DISCUSSION OF THE BACKGROUND

Semiconductor structures are used in a variety of electronic applications, and the dimensions of semiconductor structures are continuously being scaled down to meet the current application requirements. However, a variety of issues arise during the scaling-down process and impact the final electrical characteristics, quality, cost and yield. Typical memory devices (such as dynamic random access memory (DRAM) devices) include signal lines, such as word lines and bit lines crossing the word lines. As DRAM devices are scaled down and the dimensions and/or pitches of the signal lines are getting smaller, the current leakage will be a critical concern.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure. The semiconductor structure includes a device and at least one recess transistor. The device includes a substrate and a plurality of word lines. The substrate includes an array portion and a periphery portion surrounding the array portion. The plurality of word lines are disposed in the array portion. The periphery portion is free of word lines. The periphery portion of the substrate defines at least one recess. The at least one recess transistor is disposed in the at least one recess of the periphery portion of the substrate.

Another aspect of the present disclosure provides a method of manufacturing a semiconductor structure. The method includes: providing a device, wherein the device includes a substrate and a plurality of word lines, the substrate includes an array portion and a periphery portion surrounding the array portion, the plurality of word lines are disposed in the array portion, and the periphery portion is free of word lines; forming at least one recess in the periphery portion of the substrate; and forming at least one recess transistor in the at least one recess of the periphery portion of the substrate.

Another aspect of the present disclosure provides a method of manufacturing a semiconductor structure. The method includes: providing a device, wherein the device includes a substrate and a plurality of word lines and a word line nitride layer, wherein the word line nitride layer covers a top surface of the substrate and extends into the plurality of word lines; forming at least one outer trench extending through the word line nitride layer and extending into the substrate; and forming at least one recess transistor in the at least one outer trench.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
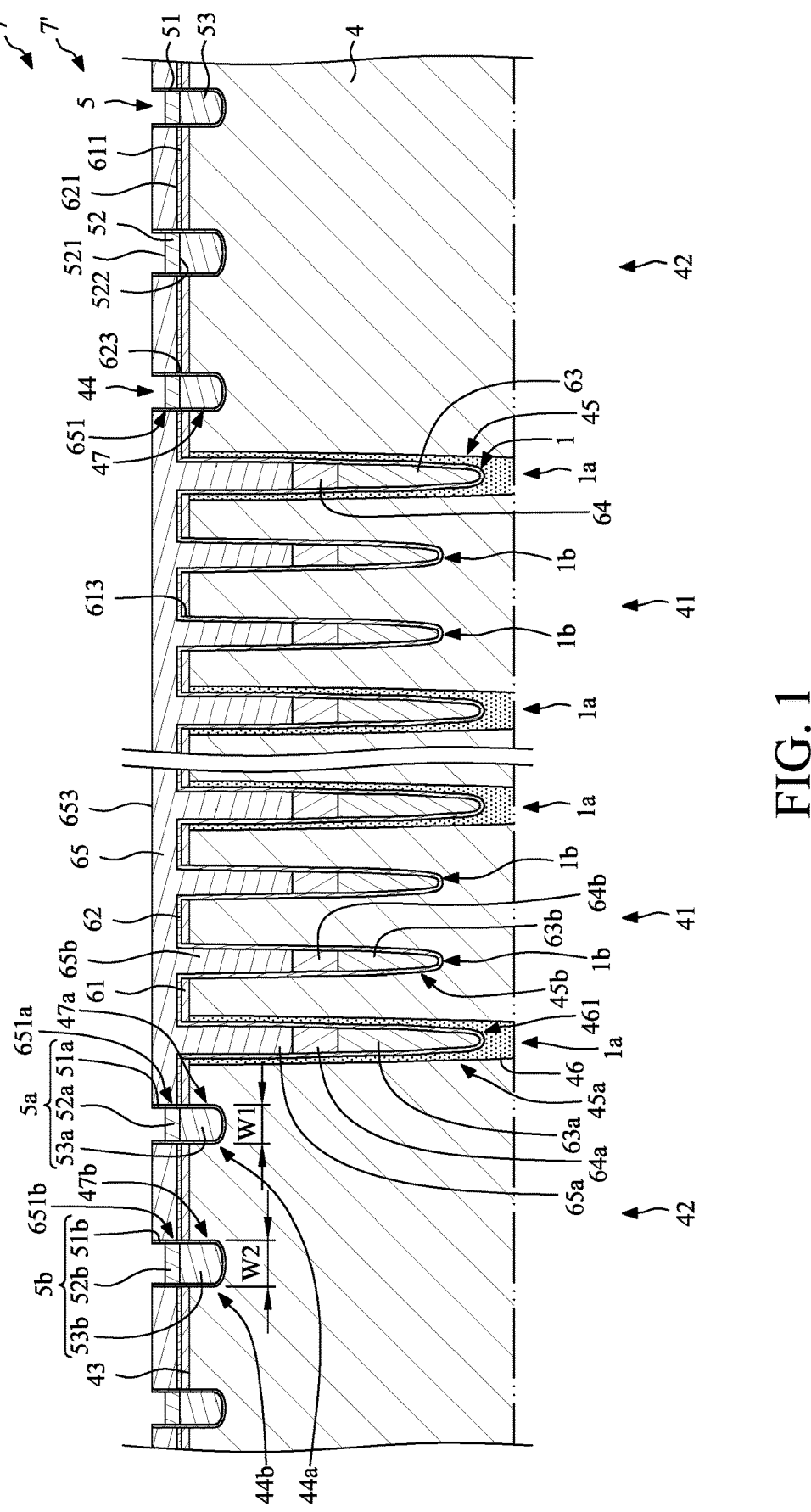
FIG. 1 is a cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor structure 7 in accordance with some embodiments of the present disclosure. In some embodiments, the semiconductor structure 7 may be a semiconductor device that includes a circuit, such as a memory cell. In some embodiments, the memory cell may include a dynamic random access memory cell (DRAM cell).

In addition, the semiconductor structure 7 may be or include a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

The semiconductor structure 7 may include a device 7' and at least one recess transistor 5. The device 7' may include a substrate 4, a plurality of word lines 1, a cover layer 61, an isolation layer 62, conductive material 63, a polysilicon layer 64 and a word line nitride layer 65. The substrate 4 may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

In some embodiments, as shown in FIG. 1, the substrate 4 may have a first surface 43 (e.g., a top surface). The substrate 4 may include an array portion 41 (or an array region) and a periphery portion 42 (or a periphery region) surrounding the array portion 41. The word lines 1 are disposed in the array portion 41, and the periphery portion 42 is free of word lines 1. That is, the array portion 41 includes all of the word lines 1 that may be arranged in an array. The periphery portion 42 includes no word lines 1. The periphery portion 42 may be a region that is outside the distribution region of the word lines 1.

The substrate 4 may define a plurality of trenches 45 and at least one recess 47. The trenches 45 and the at least one recess 47 are recessed from the first surface 43 of the substrate 4. The trenches 45 may be located within the array portion 41. The recess 47 may be located in the periphery portion 42, and located outside the array portion 41. Thus, the array portion 41 of the substrate 4 may define the trenches 45, and the periphery portion 42 of the substrate 4 may define the recess 47.

The trenches 45 may include a plurality of first trenches 45a and a plurality of second trenches 45b. The depth of the first trench 45a may be greater than the depth of the second trench 45b. An isolation material 46 may be disposed in the first trench 45a, and may define an accommodation trench 461. In some embodiments, the isolation material 46 may include, for example, oxide, and may be embedded in the substrate 4.

The cover layer 61 may be disposed on and may cover the first surface 43 of the substrate 4. In some embodiments, the cover layer 61 may include, for example, nitride. The cover layer 61 may have a first surface 611 (e.g., a top surface). The cover layer 61 may define a plurality of openings 613 to expose the second trench 45b, the accommodation trench 461 and the at least one recess 47.

The isolation layer 62 may be disposed on and may cover the first surface 611 of the cover layer 61. In some embodiments, the isolation layer 62 may include, for example, oxide. The isolation layer 62 may have a first surface 621 (e.g., a top surface). The isolation layer 62 may define a plurality of openings 623 to expose the at least one recess 47.

In addition, the isolation layer 62 may extend into the second trench 45b and the accommodation trench 461. Thus, the isolation layer 62 may be disposed on a sidewall of the second trench 45b and a sidewall of the accommodation trench 461.

In some embodiments, the conductive material 63 may be, for example, metal material. The metal material may include, for example, tungsten. The conductive material 63 may include a first conductive material 63a and a second conductive material 63b. The first conductive material 63a may be disposed on the isolation layer 62 in the accommodation trench 461. The second conductive material 63b may be disposed on the isolation layer 62 in the second trench 45b.

In some embodiments, the polysilicon layer 64 may include a first polysilicon layer 64a and a second polysilicon layer 64b. The first polysilicon layer 64a may be disposed on the first conductive material 63a in the accommodation trench 461. The second polysilicon layer 64b may be disposed on the second conductive material 63b in the second trench 45b. In some embodiments, as shown in FIG. 1, a thickness of the first polysilicon layer 64a may be substantially equal to a thickness of the second polysilicon layer 64b. An elevation of the first polysilicon layer 64a may be same as an elevation of the second polysilicon layer 64b. In some embodiments, the thickness of the first polysilicon layer 64a may be less than a thickness of the first conductive material 63a. The thickness of the second polysilicon layer 64b may be less than a thickness of the second conductive material 63b.

The word line nitride layer 65 may be disposed on and may cover the first surface 621 of the isolation layer 62. Thus, the word line nitride layer 65 may cover the array portion 41 and the periphery portion 42 (e.g., the first surface 43 of the substrate 4). The word line nitride layer 65 may have a first surface 653 (e.g., a top surface). The word line nitride layer 65 may define a plurality of openings 651 to expose the at least one recess 47. In addition, the word line nitride layer 65 may extend into the second trench 45b and the accommodation trench 461. For example, a first portion 65a of the word line nitride layer 65 may extend into the accommodation trench 461 to contact the first polysilicon layer 64a. A second portion 65b of the word line nitride layer 65 may extend into the second trench 45b to contact the second polysilicon layer 64b.

As shown in FIG. 1, the word lines 1 may include a plurality of first word lines 1a and a plurality of second word lines 1b. The first word lines 1a may be disposed in the accommodation trench 461, and may include the first conductive material 63a, the first polysilicon layer 64a and the first portion 65a of the word line nitride layer 65. The second word lines 1b may be disposed in the second trench 45b, and may include the second conductive material 63b, the second polysilicon layer 64b and the second portion 65b of the word line nitride layer 65. The word line nitride layer 65 may extend into the word lines 1. For example, the first portion 65a of the word line nitride layer 65 may extend into the first word line 1a. The second portion 65b of the word line nitride layer 65 may extend into the second word line 1b.

The at least one recess 47 of the periphery portion 42 of the substrate 4 may include a plurality of recesses 47. As shown in FIG. 1, the recesses 47 may include at least one first recess 47a and at least one second recess 47b. A width W1 of the first recess 47a may different from a width W2 of the second recess 47b. For example, the width W1 of the first recess 47a may be less than the width W2 of the second recess 47b.

In addition, the word line nitride layer 65 may defines at least one opening 651 corresponding to the at least one recess 47 of the periphery portion 42. The opening 651 may extend through the word line nitride layer 65, and may include a first opening 651a and a second opening 651b. The first opening 651a may correspond to the first recess 47a, and the second opening 651b may correspond to the second recess 47b. In some embodiments, the opening 651 of the word line nitride layer 65, the recess 47 of the periphery portion 42, the opening 613 of the cover layer 61 and the opening 623 of the isolation layer 62 may collectively form at least one outer trench 44 recessed from the first surface 653 of the word line nitride layer 65. The outer trench 44 may include a first outer trench 44a and a second outer trench 44b. For example, the first opening 651a, the first recess 47a, the opening 613 of the cover layer 61 and the opening 623 of the isolation layer 62 may collectively form the first outer trench 44a recessed from the first surface 653 of the word line nitride layer 65. Further, the second opening 651b, the second recess 47b, the opening 613 of the cover layer 61 and the opening 623 of the isolation layer 62 may collectively form the second outer trench 44b recessed from the first surface 653 of the word line nitride layer 65.

The recess transistor 5 may be disposed in the outer trench 44. Thus, the recess transistor 5 may be disposed in the periphery portion 42 of the substrate 4. The recess transistor 5 may include an insulation layer 51, a polysilicon layer 53 and a gate conductor 52. The insulation layer 51 may be disposed on a sidewall of the outer trench 44. The polysilicon layer 53 may be disposed on the insulation layer 51 in the recess 47 of the periphery portion 42 of the substrate 4. Thus, the insulation layer 51 may be disposed between the polysilicon layer 53 and the periphery portion 42 of the substrate 4. The gate conductor 52 may be disposed on the polysilicon layer 53 and the insulation layer 51. Thus, the gate conductor 52 may be disposed in the opening 651 of the word line nitride layer 65. The insulation layer 51 may be disposed between the gate conductor 52 and the word line nitride layer 65. Therefore, the recess transistor 5 may be disposed in the recess 47 of the periphery portion 42 of the substrate 4 and in the opening 651 of the word line nitride layer 65.

As shown in FIG. 1, a bottom surface 522 of the gate conductor 52 may be higher than the first surface 43 (e.g., the top surface) of the substrate 4. In some embodiments, the bottom surface 522 of the gate conductor 52 may be higher than the first surface 611 (e.g., the top surface) of the cover layer 61. The bottom surface 522 of the gate conductor 52 may be lower than the first surface 621 (e.g., the top surface) of the isolation layer 62. In addition, a top surface 521 of the gate conductor 52 may be lower than the first surface 653 (e.g., the top surface) of the word line nitride layer 65, and may be higher than the first surface 621 (e.g., the top surface) of the isolation layer 62.

In some embodiments, the insulation layer 51 may include a first insulation layer 51a and a second insulation layer 51b. The polysilicon layer 53 may include a first polysilicon layer 53a and a second polysilicon layer 53b. The gate conductor 52 may include a first gate conductor 52a and a second gate conductor 52b. The first insulation layer 51a may be disposed on a sidewall of the first outer trench 44a. The first polysilicon layer 53a may be disposed on the first insulation layer 51a in the first recess 47a of the periphery portion 42 of the substrate 4. Thus, the first insulation layer 51a may be disposed between the first polysilicon layer 53a and the periphery portion 42 of the substrate 4. The first gate conductor 52a may be disposed on the first polysilicon layer 53a and the first insulation layer 51a. Thus, the first gate conductor 52a may be disposed in the first opening 651a of the word line nitride layer 65. The first insulation layer 51a may be disposed between the first gate conductor 52a and the word line nitride layer 65. The first insulation layer 51a, the first polysilicon layer 53a and the first gate conductor 52a may collectively form a first recess transistor 5a. The first recess transistor 5a may be disposed in the first outer trench 44a, and may have a width W1.

The second insulation layer 51b may be disposed on a sidewall of the second outer trench 44b. The second polysilicon layer 53b may be disposed on the second insulation layer 51b in the second recess 47b of the periphery portion 42 of the substrate 4. Thus, the second insulation layer 51b may be disposed between the second polysilicon layer 53b and the periphery portion 42 of the substrate 4. The second gate conductor 52b may be disposed on the second polysilicon layer 53b and the second insulation layer 51b. Thus, the second gate conductor 52b may be disposed in the second opening 651b of the word line nitride layer 65. The second insulation layer 51b may be disposed between the second gate conductor 52b and the word line nitride layer 65. The second insulation layer 51b, the second polysilicon layer 53b and the second gate conductor 52b may collectively form a second recess transistor 5b. The second recess transistor 5b may be disposed in the second outer trench 44b, and may have a width W2. Therefore, the recess transistor 5 may include a plurality of recess transistors 5a, 5b with different widths W1, W2.

In the embodiment illustrated in FIG. 1, the recess transistor 5 (including, for example, the first recess transistor 5a and the second recess transistor 5b) is recessed from the first surface 653 (e.g., the top surface) of the word line nitride layer 65, thus, the size (e.g., thickness) of the semiconductor structure 7 may be reduced. In addition, the recess transistor 5 (including, e.g., the first recess transistor 5a and the second recess transistor 5b) can improve the leakage issue since the channel length of the recess transistor 5 (including, for example, the first recess transistor 5a and the second recess transistor 5b) is relatively long. Further, the widths W1, W2 of the recess transistor 5 (including, for example, the first recess transistor 5a and the second recess transistor 5b) may be reduced.

Figure 2:
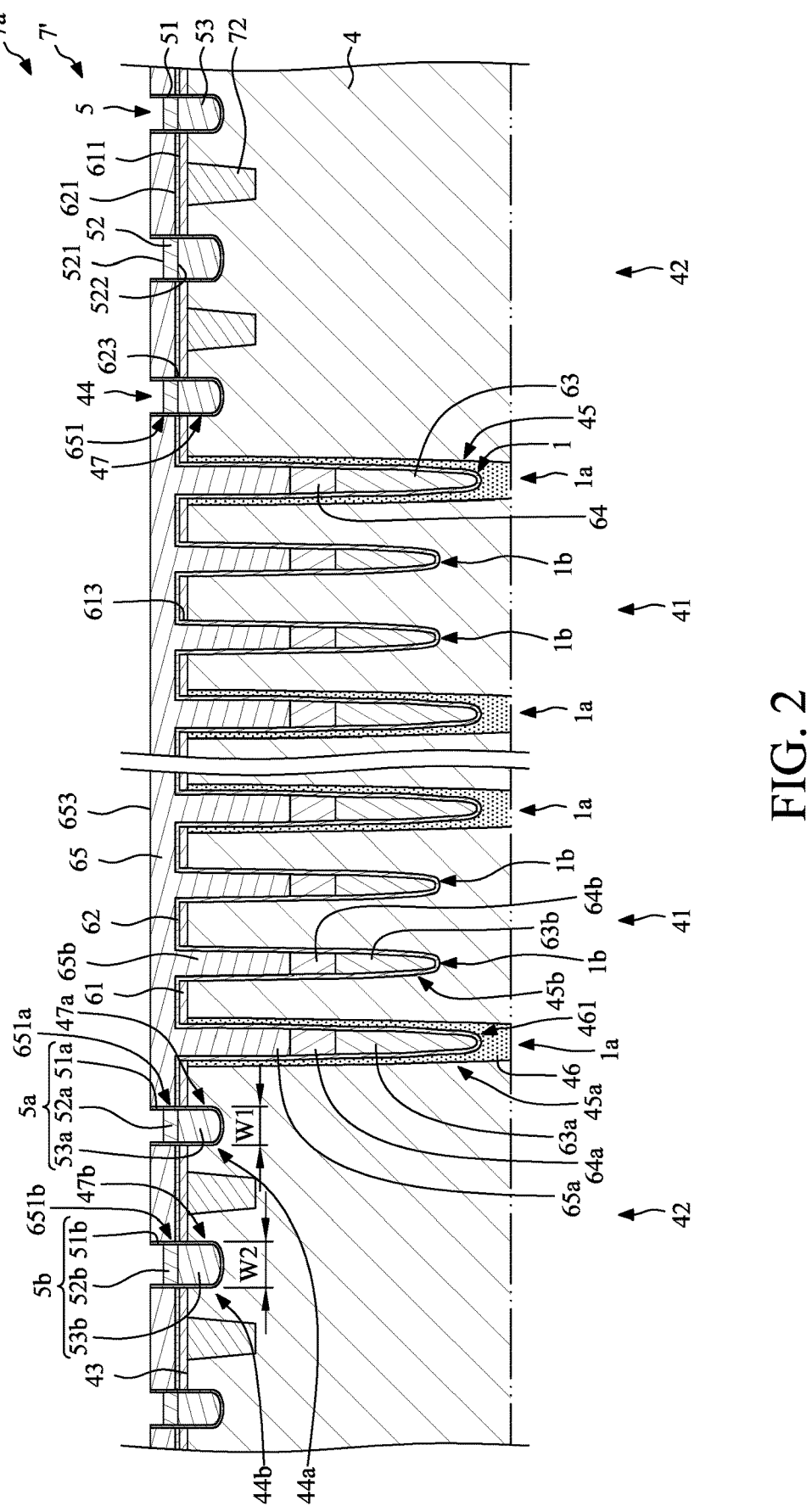
FIG. 2 is a cross-sectional view of a semiconductor structure in accordance with some embodiments of the present disclosure.

FIG. 2 is a cross-sectional view of a semiconductor structure 7a in accordance with some embodiments of the present disclosure. The semiconductor structure 7a may be similar to the semiconductor structure 7 of FIG. 1, except that at least one shallow trench isolation (STI) 72 may be further included.

As shown in FIG. 2, the semiconductor structure 7a further includes a plurality of STIs 72 embedded in the substrate 4. A top surface of the STI 72 may be substantially coplanar with the first surface 43 of the substrate 4. The STI 72 may be disposed between the recess transistors 5 (including, for example, the first recess transistor 5a and the second recess transistor 5b) so as to provide an isolation between the recess transistors 5.

Figure 3:
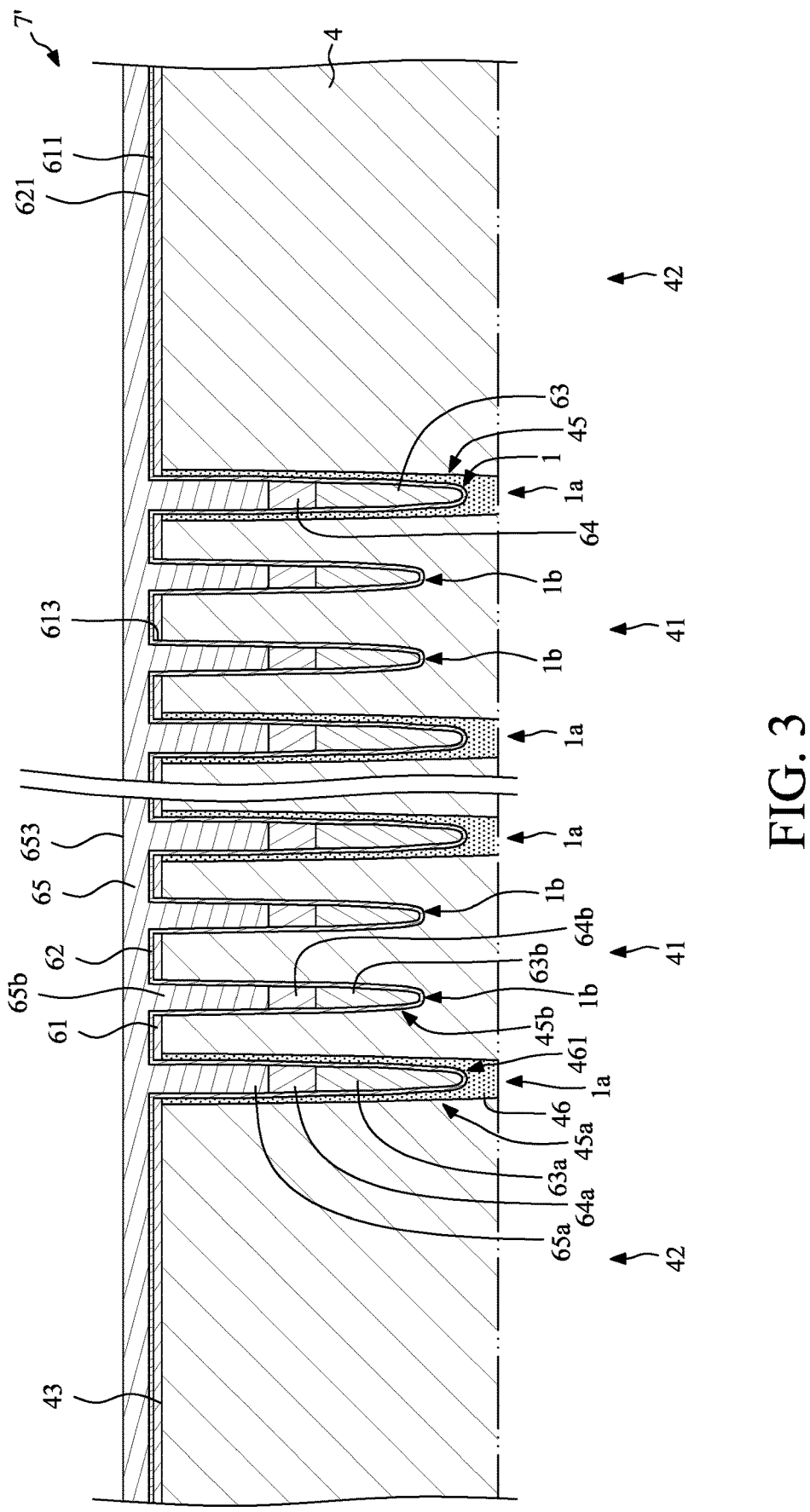
FIG. 3 illustrates a cross-sectional view of one or more stages of an example of a method of manufacturing a semiconductor structure according to some embodiments of the present disclosure.

FIG. 3 through FIG. 15 illustrate a method of manufacturing a semiconductor structure 7 according to some embodiments of the present disclosure. Referring to FIG. 3, a device 7' is provided. The device 7' of FIG. 3 may be same as or similar to the device 7' of FIG. 1.

The device 7' may include a substrate 4, a plurality of word lines 1, a cover layer 61, an isolation layer 62, conductive material 63, a polysilicon layer 64 and a word line nitride layer 65. The substrate 4 may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

The substrate 4 may have a first surface 43 (e.g., a top surface). The substrate 4 may include an array portion 41 (or an array region) and a periphery portion 42 (or a periphery region) surrounding the array portion 41. The word lines 1 are disposed in the array portion 41, and the periphery portion 42 is free of word lines 1. That is, the array portion 41 includes all of the word lines 1 that may be arranged in an array. The periphery portion 42 includes no word lines 1. The periphery portion 42 may be a region that is outside the distribution region of the word lines 1.

The substrate 4 may define a plurality of trenches 45. The trenches 45 are recessed from the first surface 43 of the substrate 4. The trenches 45 may be located within the array portion 41. Thus, the array portion 41 of the substrate 4 may define the trenches 45. The trenches 45 may include a plurality of first trenches 45a and a plurality of second trenches 45b. The depth of the first trench 45a may be greater than the depth of the second trench 45b. An isolation material 46 may be disposed in the first trench 45a, and may define an accommodation trench 461. In some embodiments, the isolation material 46 may include, for example, oxide, and may be embedded in the substrate 4.

The cover layer 61 may be disposed on and may cover the first surface 43 of the substrate 4. In some embodiments, the cover layer 61 may include, for example, nitride. The cover layer 61 may have a first surface 611 (e.g., a top surface). The cover layer 61 may define a plurality of openings 613 to expose the second trench 45b and the accommodation trench 461.

The isolation layer 62 may be disposed on and may cover the first surface 611 of the cover layer 61. In some embodiments, the isolation layer 62 may include, for example, oxide. The isolation layer 62 may have a first surface 621 (e.g., a top surface). In addition, the isolation layer 62 may extend into the second trench 45b and the accommodation trench 461. Thus, the isolation layer 62 may be disposed on a sidewall of the second trench 45b and a sidewall of the accommodation trench 461.

In some embodiments, the conductive material 63 may be, for example, metal material. The metal material may include, for example, tungsten. The conductive material 63 may include a first conductive material 63a and a second conductive material 63b. The first conductive material 63a may be disposed on the isolation layer 62 in the accommodation trench 461. The second conductive material 63b may be disposed on the isolation layer 62 in the second trench 45b.

In some embodiments, the polysilicon layer 64 may include a first polysilicon layer 64a and a second polysilicon layer 64b. The first polysilicon layer 64a may be disposed on the first conductive material 63a in the accommodation trench 461. The second polysilicon layer 64b may be disposed on the second conductive material 63b in the second trench 45b.

The word line nitride layer 65 may be disposed on and may cover the first surface 621 of the isolation layer 62. Thus, the word line nitride layer 65 may cover the array portion 41 and the periphery portion 42 (e.g., the first surface 43 (e.g., the top surface) of the substrate 4). The word line nitride layer 65 may have a first surface 653 (e.g., a top surface). In addition, the word line nitride layer 65 may extend into the second trench 45b and the accommodation trench 461. For example, a first portion 65a of the word line nitride layer 65 may extend into the accommodation trench 461 to contact the first polysilicon layer 64a. A second portion 65b of the word line nitride layer 65 may extend into the second trench 45b to contact the second polysilicon layer 64b.

As shown in FIG. 3, the word lines 1 may include a plurality of first word lines 1a and a plurality of second word lines 1b. The first word lines 1a may be disposed in the accommodation trench 461, and may include the first conductive material 63a, the first polysilicon layer 64a and the first portion 65a of the word line nitride layer 65. The second word lines 1b may be disposed in the second trench 45b, and may include the second conductive material 63b, the second polysilicon layer 64b and the second portion 65b of the word line nitride layer 65. The word line nitride layer 65 may extend into the word lines 1. For example, the first portion 65a of the word line nitride layer 65 may extend into the first word line 1a. The second portion 65b of the word line nitride layer 65 may extend into the second word line 1b.

Figure 4:
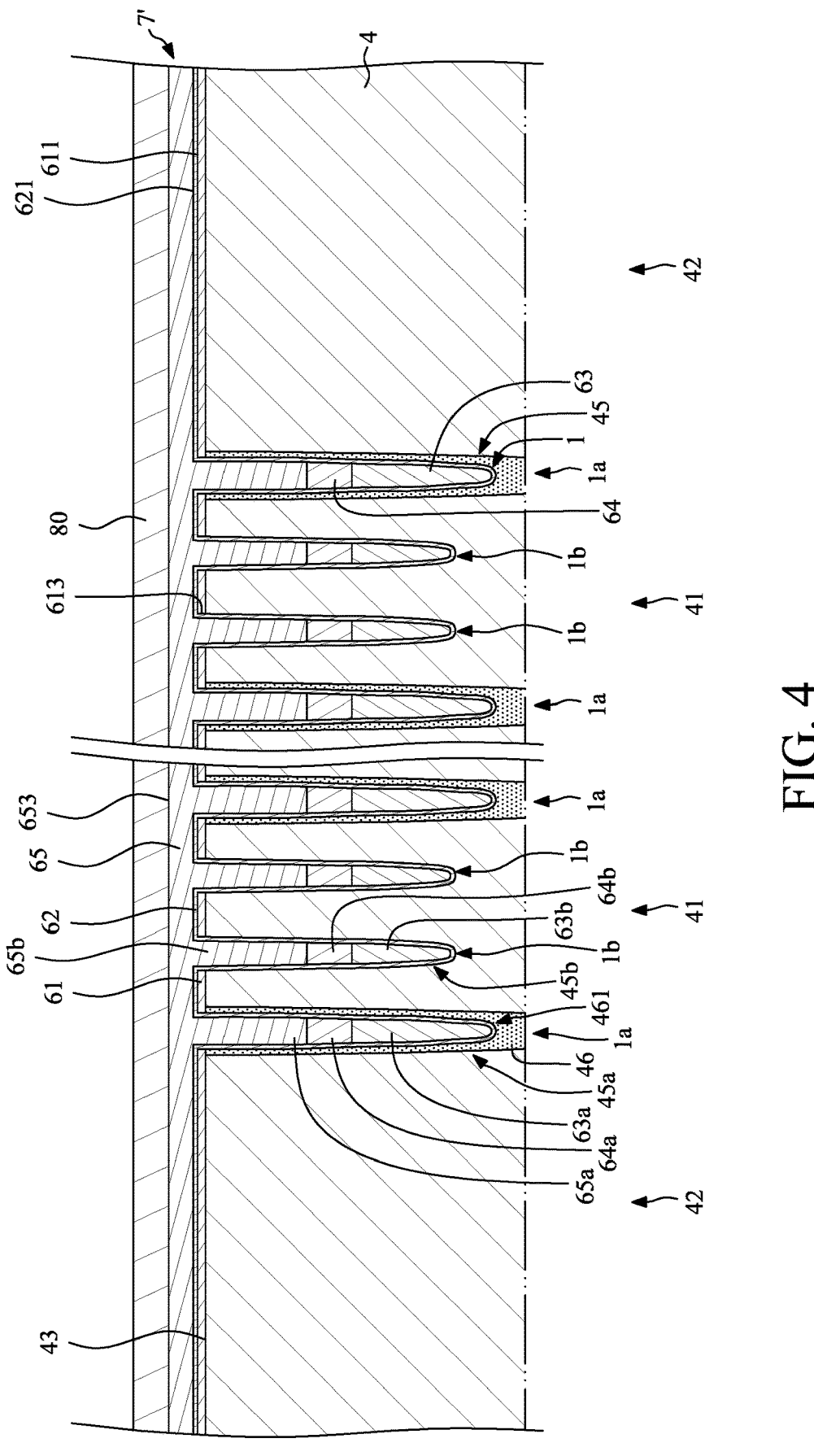
FIG. 4 illustrates a cross-sectional view of one or more stages of an example of a method of manufacturing a semiconductor structure according to some embodiments of the present disclosure.

Referring to FIG. 4, a mask layer (e.g., a hard mask) 80 may be formed or disposed on the first surface 653 (e.g., a top surface) of the word line nitride layer 65 by, for example, deposition. Alternatively, the mask layer (e.g., a hard mask) 80 may be formed or disposed on the array portion 41 and the periphery portion 42 of the substrate 4 (e.g., the first surface 43 of the substrate 4).

Figure 5:
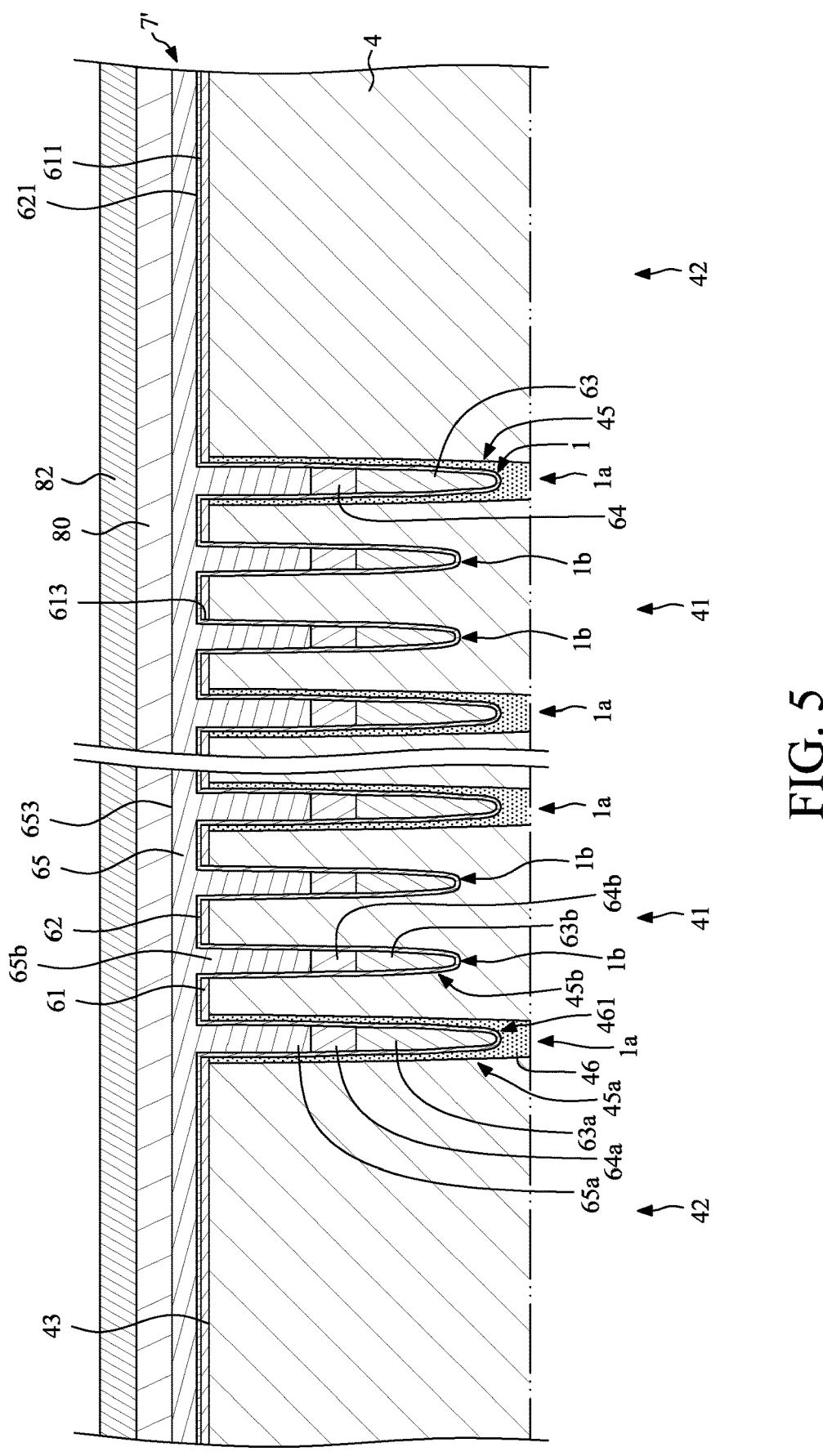
FIG. 5 illustrates a cross-sectional view of one or more stages of an example of a method of manufacturing a semiconductor structure according to some embodiments of the present disclosure.

Referring to FIG. 5, a photoresist layer 82 may be formed or disposed on the mask layer 80.

Figure 6:
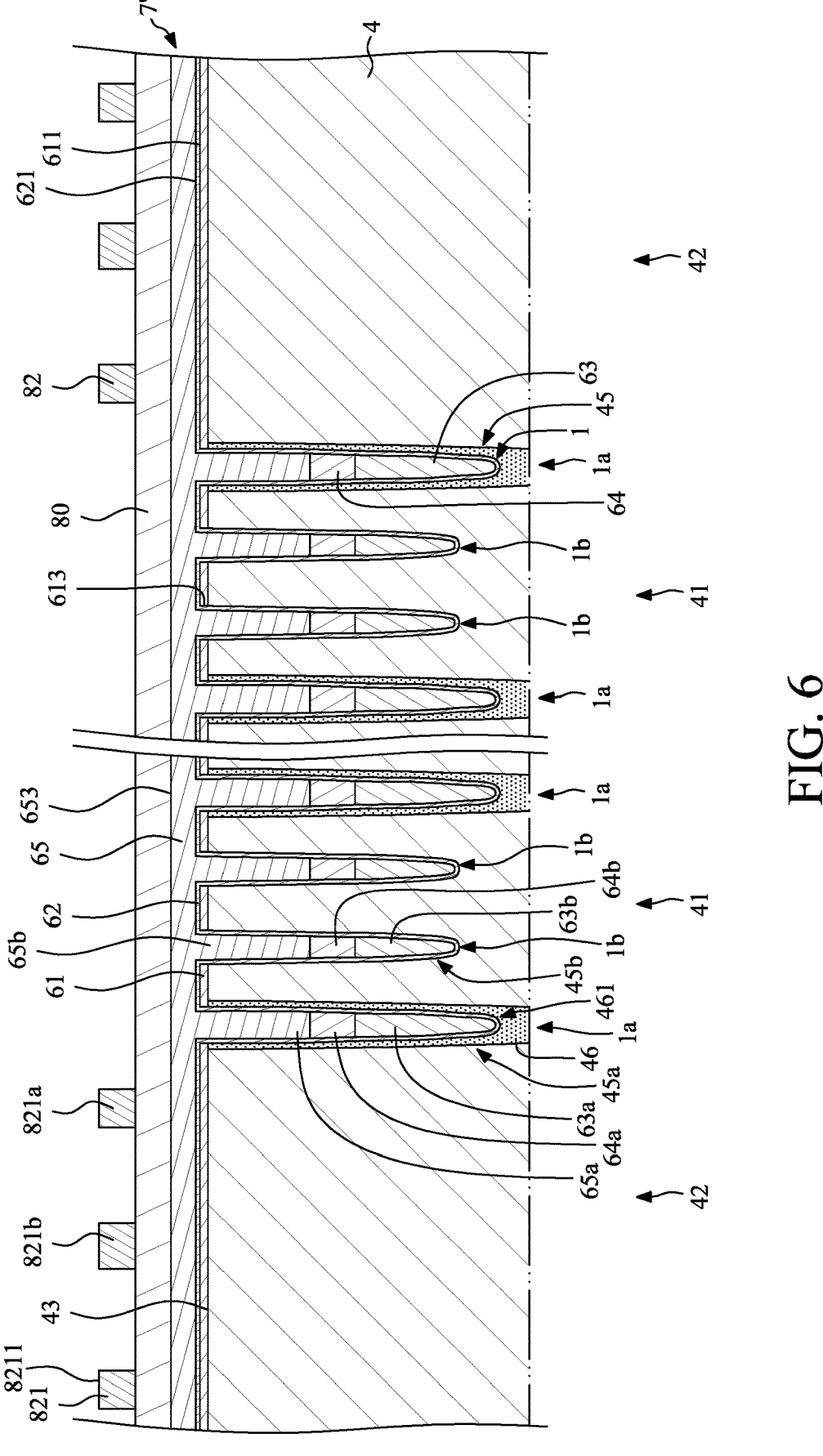
FIG. 6 illustrates a cross-sectional view of one or more stages of an example of a method of manufacturing a semiconductor structure according to some embodiments of the present disclosure.

Referring to FIG. 6, the photoresist layer 82 may be patterned to include a plurality of remaining portions 821 spaced apart from each other. For example, the remaining portions 821 may include a first remaining portion 821a and a second remaining portions 821b spaced apart from each other. In some embodiments, the remaining portions 821 may be trimmed. Each of the remaining portions 821 may have a top surface 8211.

Figure 7:
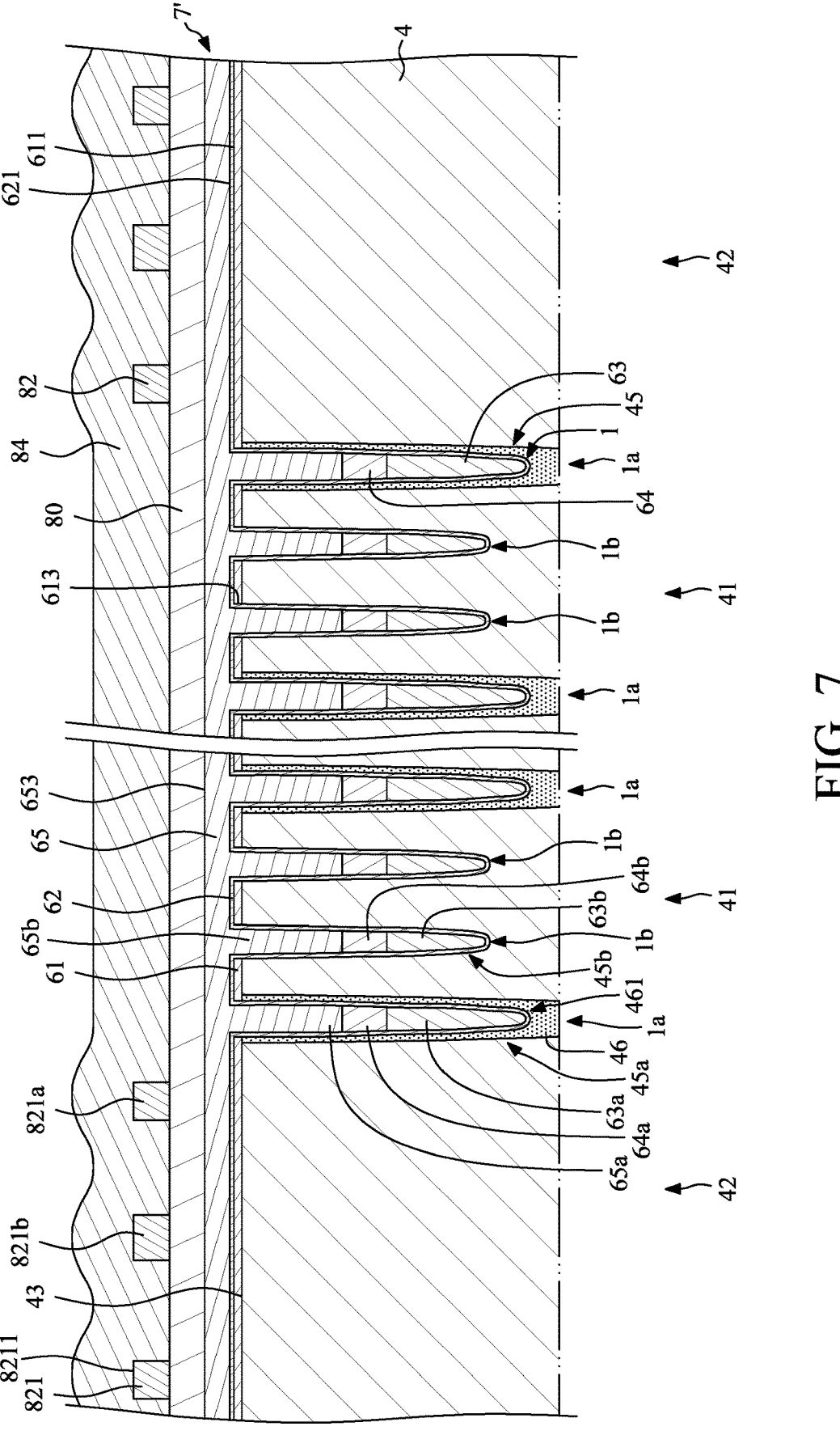
FIG. 7 illustrates a cross-sectional view of one or more stages of an example of a method of manufacturing a semiconductor structure according to some embodiments of the present disclosure.

Referring to FIG. 7, a sacrificial layer 84 may be formed or disposed on the mask layer 80 to cover the remaining portions 821 of the patterned photoresist layer 82. The sacrificial layer 84 may include oxide, and may be formed by, for example, deposition. In some embodiments, the thickness of the sacrificial layer 84 may be greater than the thickness of the patterned photoresist layer 82. Thus, the sacrificial layer 84 may cover a plurality of top surfaces 8211 of the remaining portions 821 of the patterned photoresist layer 82.

Figure 8:
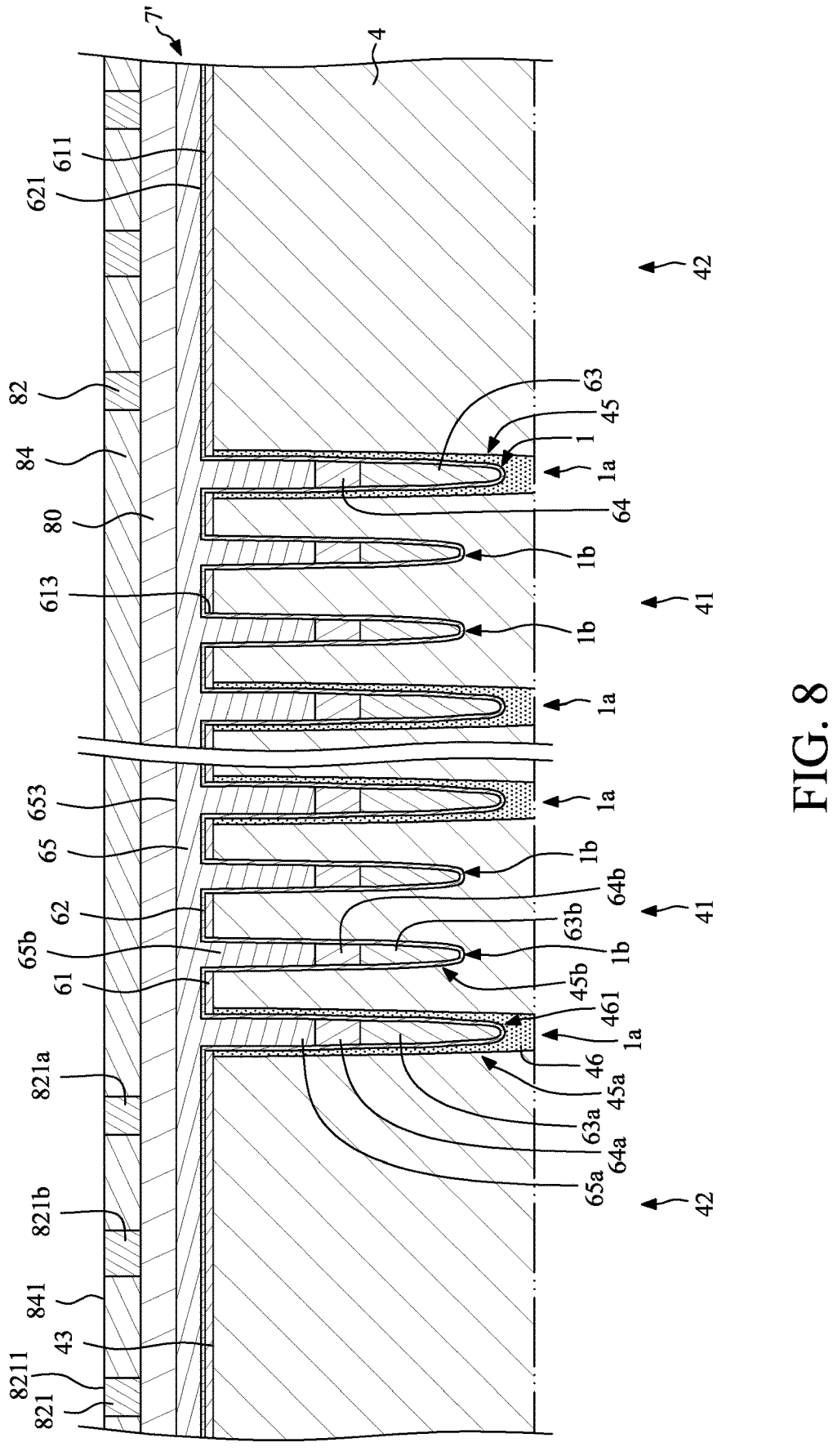
FIG. 8 illustrates a cross-sectional view of one or more stages of an example of a method of manufacturing a semiconductor structure according to some embodiments of the present disclosure.

Referring to FIG. 8, the sacrificial layer 84 may be thinned to expose the top surfaces 8211 of the remaining portions 821 of the patterned photoresist layer 82 by, for example, etching. Meanwhile, a top surface 841 of the sacrificial layer 84 may be substantially coplanar with the top surfaces 8211 of the remaining portions 821 of the patterned photoresist layer 82.

Figure 9:
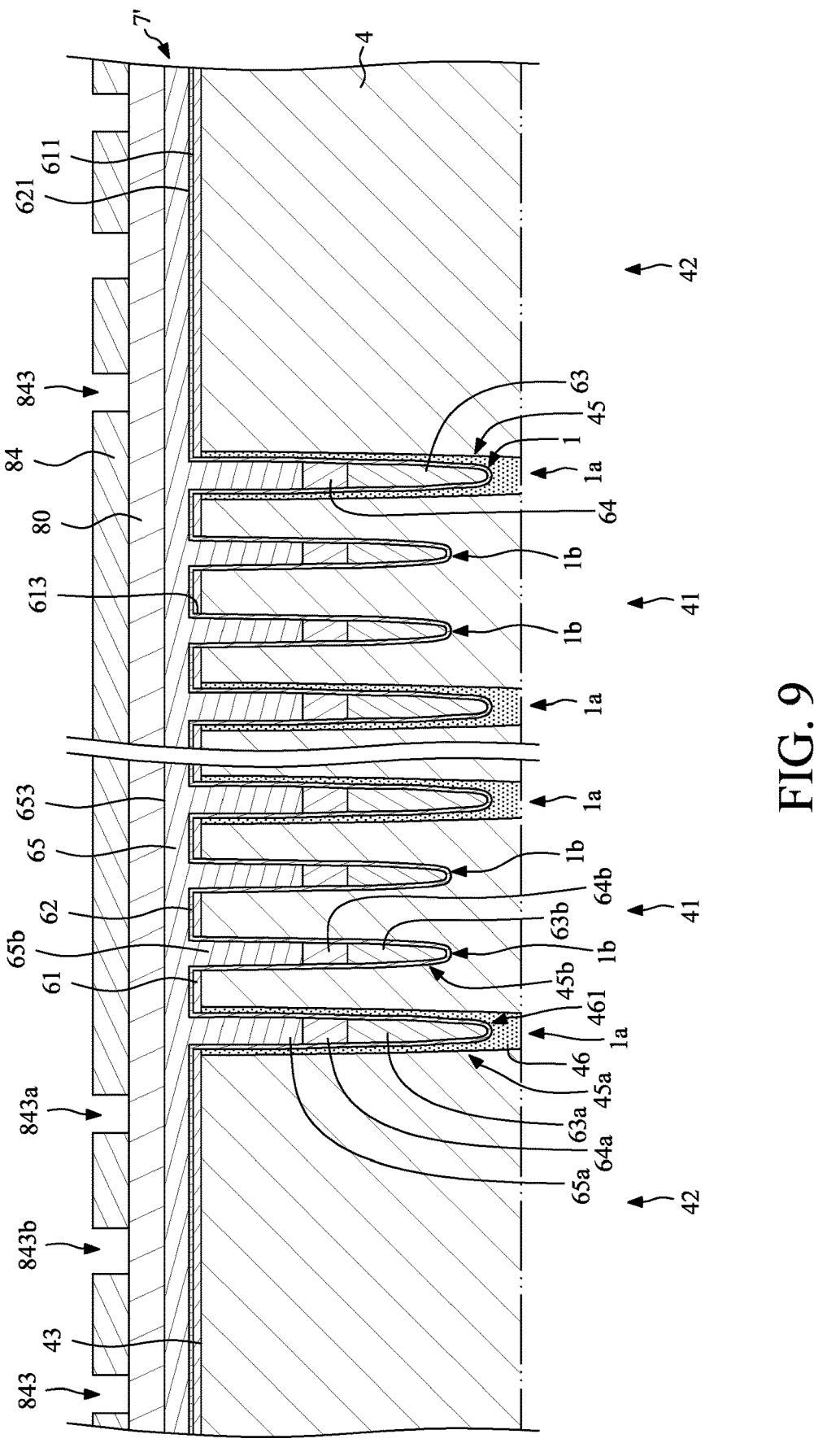
FIG. 9 illustrates a cross-sectional view of one or more stages of an example of a method of manufacturing a semiconductor structure according to some embodiments of the present disclosure.

Referring to FIG. 9, the remaining portions 821 of the patterned photoresist layer 82 may be removed by, for example, stripping, so to form a plurality of openings 843 in the sacrificial layer 84. The size and position of the openings 843 of the sacrificial layer 84 may correspond to the size and position of the remaining portions 821 of the patterned photoresist layer 82. For example, the openings 843 of the sacrificial layer 84 may include a first opening 843a corresponding to the first remaining portion 821a and a second opening 843b corresponding to the second remaining portions 821b. In addition, the openings 843 (including, for example, the first opening 843a and the second opening 843b) of the sacrificial layer 84 expose portions of the mask layer 80.

Figure 10:
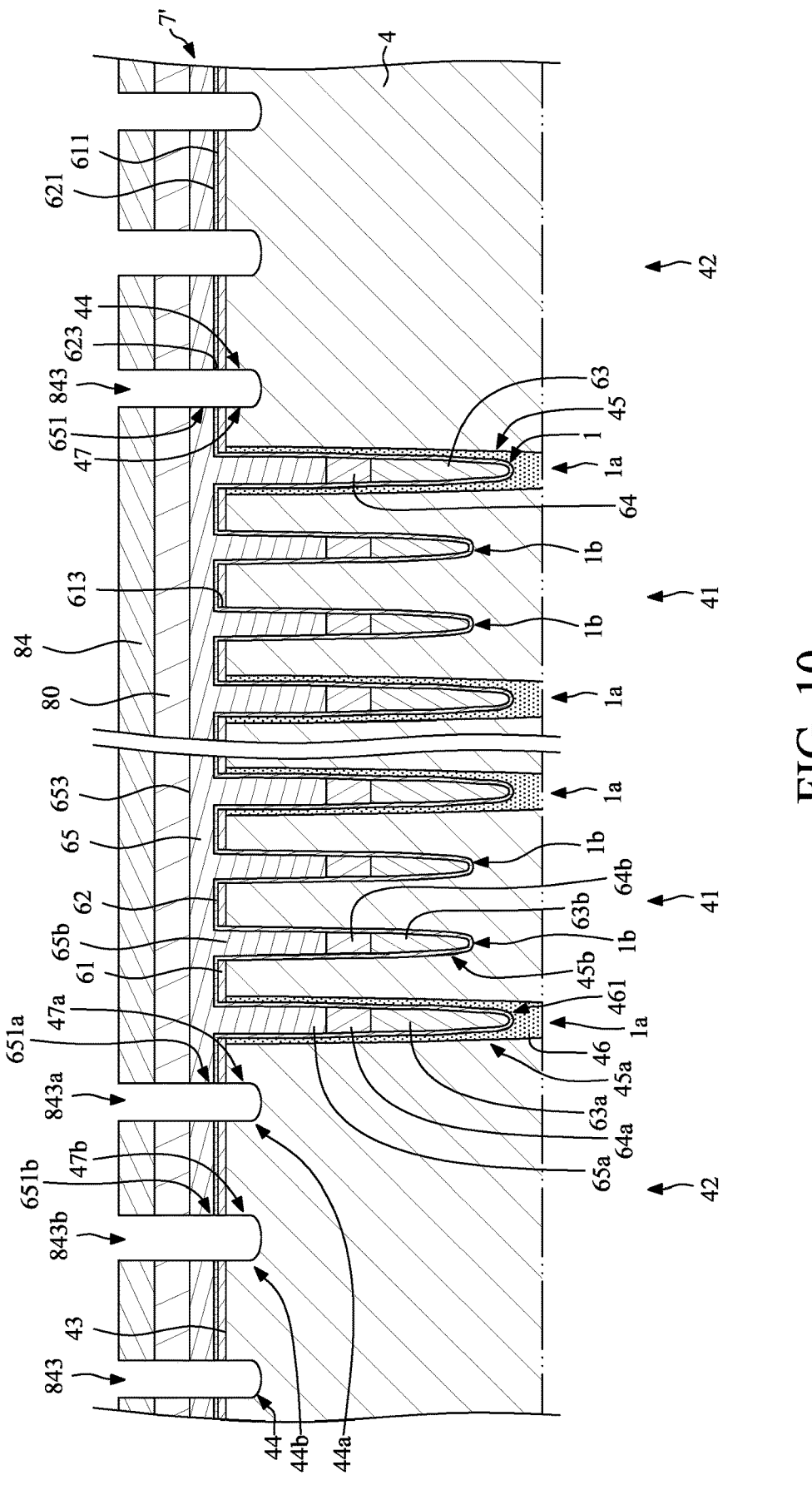
FIG. 10 illustrates a cross-sectional view of one or more stages of an example of a method of manufacturing a semiconductor structure according to some embodiments of the present disclosure.

Referring to FIG. 10, portions of the word line nitride layer 65, portions of the isolation layer 62, portions of the cover layer 61 and portions of the periphery portion 42 may be removed concurrently so as to form a plurality of outer trenches 44 according to the openings 843 of the sacrificial layer 84. The outer trenches 44 may extend through the word line nitride layer 65, the isolation layer 62 and the cover layer 61, and extend into the periphery portion 42 of the substrate 4. For example, the outer trenches 44 may include a first outer trench 44a corresponding to the first opening 843a and a second outer trench 44b corresponding to the second opening 843b.

Figure 11:
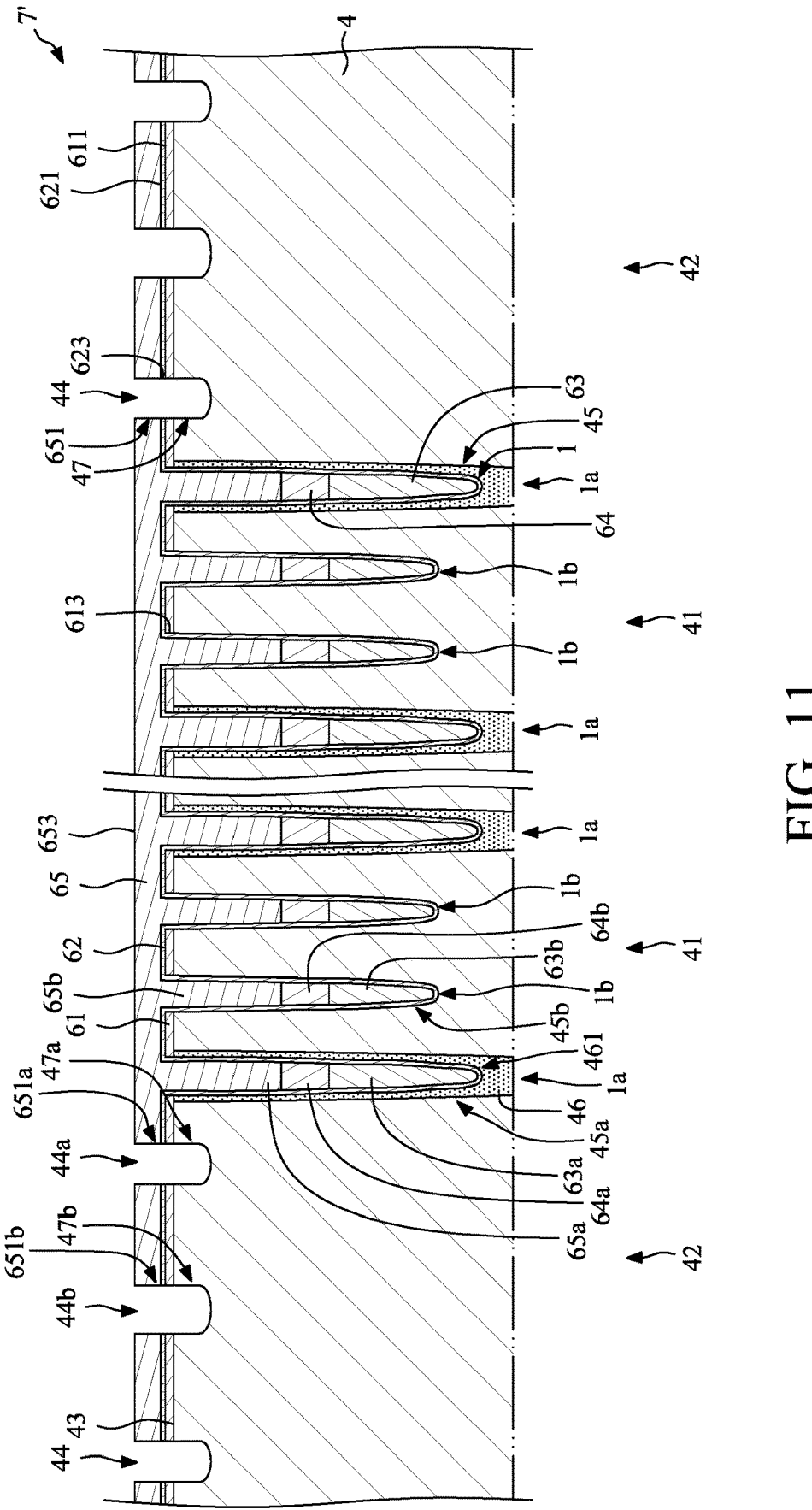
FIG. 11 illustrates a cross-sectional view of one or more stages of an example of a method of manufacturing a semiconductor structure according to some embodiments of the present disclosure.

Referring to FIG. 11, the sacrificial layer 84 and the mask layer 80 may be removed. As shown in FIG. 11, the first outer trench 44a may be recessed from the first surface 653 of the word line nitride layer 65, and may include the first opening 651a of the word line nitride layer 65, the first recess 47a of the periphery portion 42, the opening 613 of the cover layer 61 and the opening 623 of the isolation layer 62. The second outer trench 44b may be recessed from the first surface 653 of the word line nitride layer 65, and may include the second opening 651b of the word line nitride layer 65, the second recess 47b of the periphery portion 42, the opening 613 of the cover layer 61 and the opening 623 of the isolation layer 62. Therefore, the recess 47 (including, for example, the first recess 47a and the second recess 47b) may be formed in the periphery portion 42 of the substrate 4.

Figure 12:
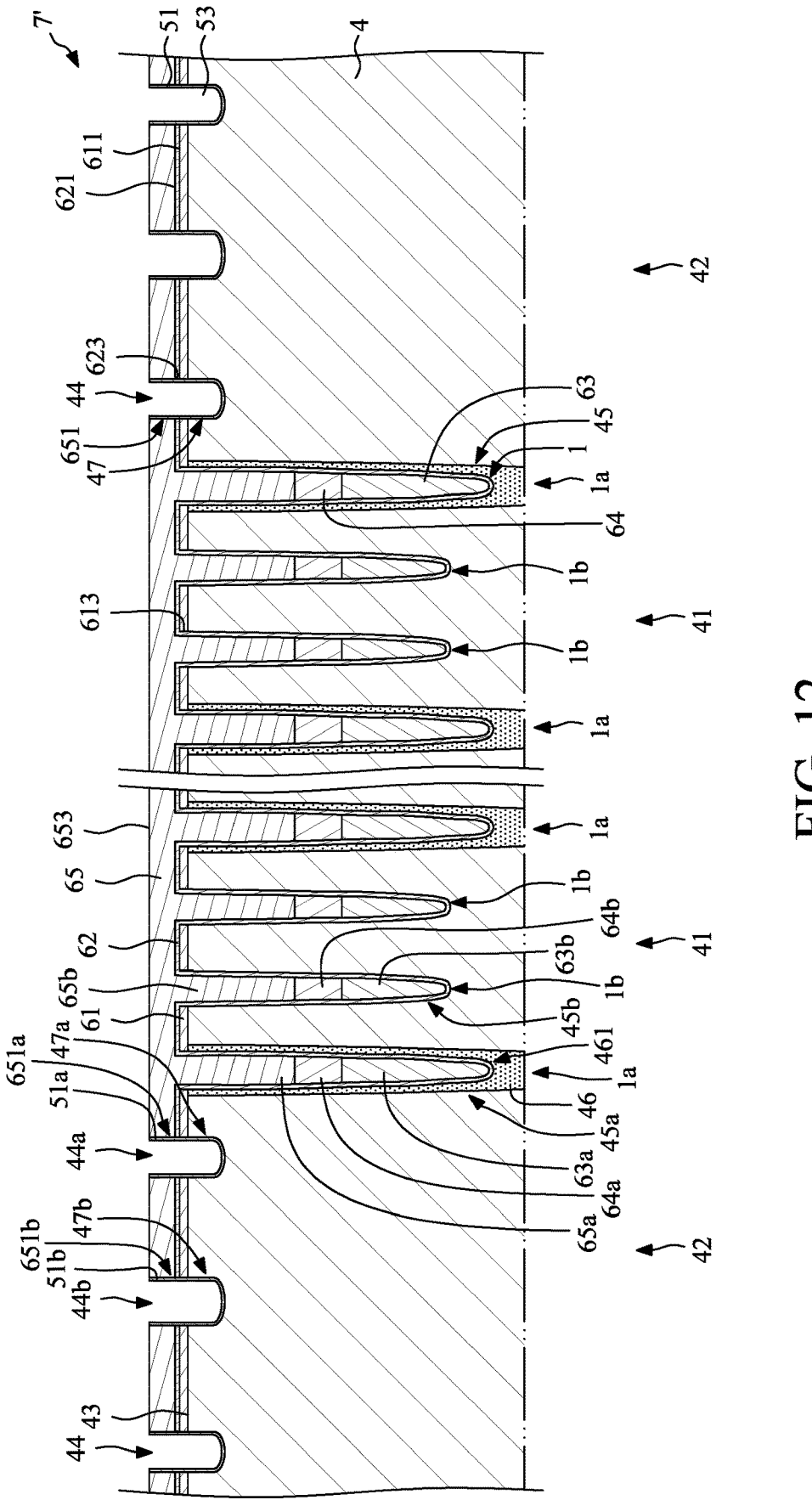
FIG. 12 illustrates a cross-sectional view of one or more stages of an example of a method of manufacturing a semiconductor structure according to some embodiments of the present disclosure.

Referring to FIG. 12 to FIG. 15, a recess transistor 5 may be formed in the outer trench 44 and in the recess 47 of the periphery portion 42 of the substrate 4. Referring to FIG. 12, an insulation layer 51 may be formed or disposed on a sidewall of the outer trench 44. Alternatively, the insulation layer 51 may be formed or disposed on a sidewall of the recess 47, on a sidewall of the opening 613 of the cover layer 61, on a sidewall of the opening 623 of the isolation layer 62 and on a sidewall of the opening 651 of the word line nitride layer 65.

For example, the insulation layer 51 may include a first insulation layer 51a and a second insulation layer 51b. The first insulation layer 51a may be disposed on a sidewall of the first outer trench 44a. That is, the first insulation layer 51a may be disposed on a sidewall of the first recess 47a of the periphery portion 42 and on a sidewall of the first opening 651a of the word line nitride layer 65. In addition, the second insulation layer 51b may be disposed on a sidewall of the second outer trench 44b. That is, the second insulation layer 51b may be disposed on a sidewall of the second recess 47b of the periphery portion 42 and on a sidewall of the second opening 651b of the word line nitride layer 65.

Figure 13:
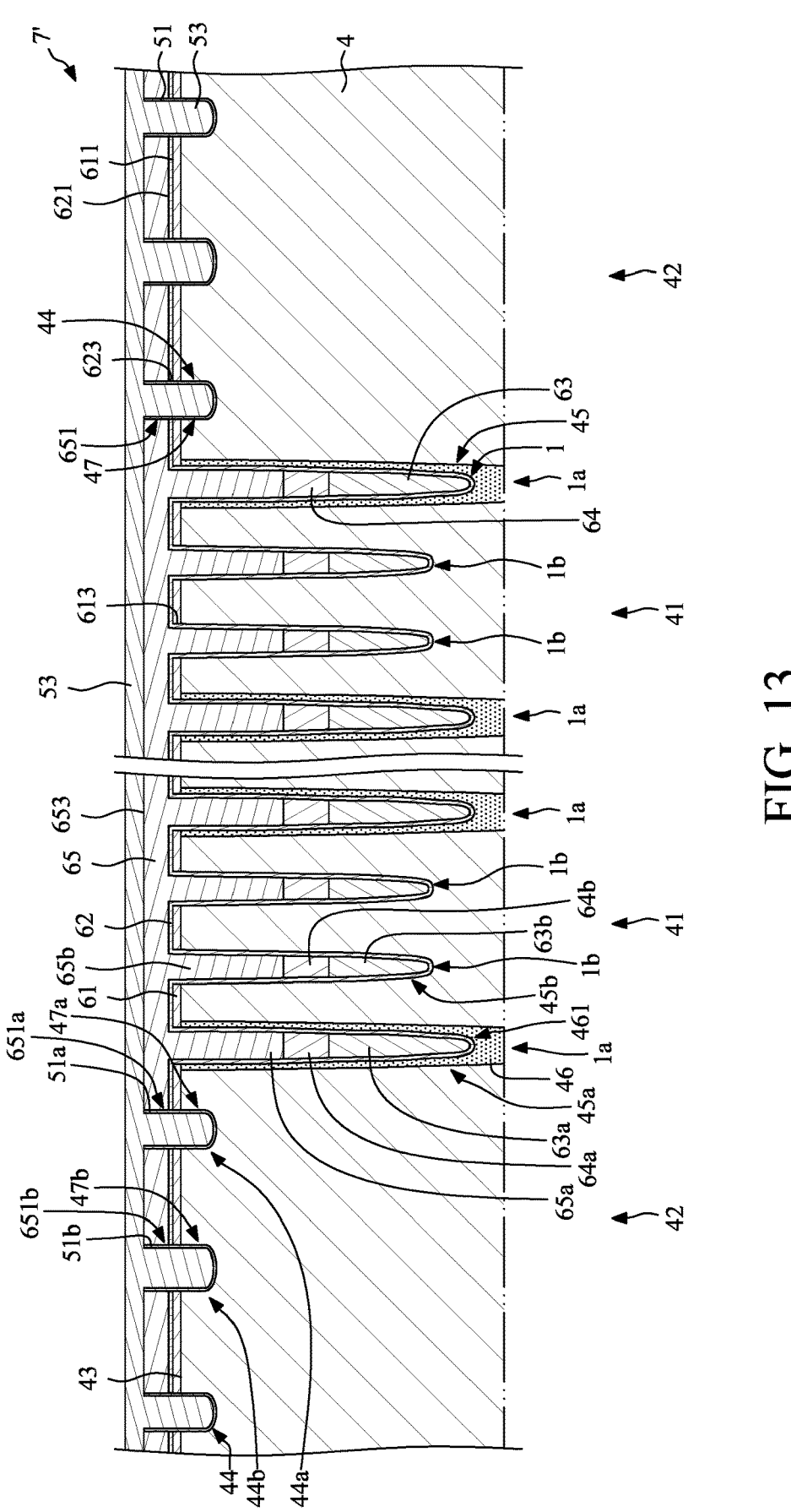
FIG. 13 illustrates a cross-sectional view of one or more stages of an example of a method of manufacturing a semiconductor structure according to some embodiments of the present disclosure.

Referring to FIG. 13, a polysilicon layer 53 may be formed or disposed on the first surface 653 of the word line nitride layer 65 (i.e., on the first surface 43 (e.g., the top surface) of the substrate 4) and may fill in the outer trench 44 by, for example, deposition. Thus, the polysilicon layer 53 may be formed or disposed on the insulation layer 51 in the outer trench 44 and in the recess 47 of the periphery portion 42.

Figure 14:
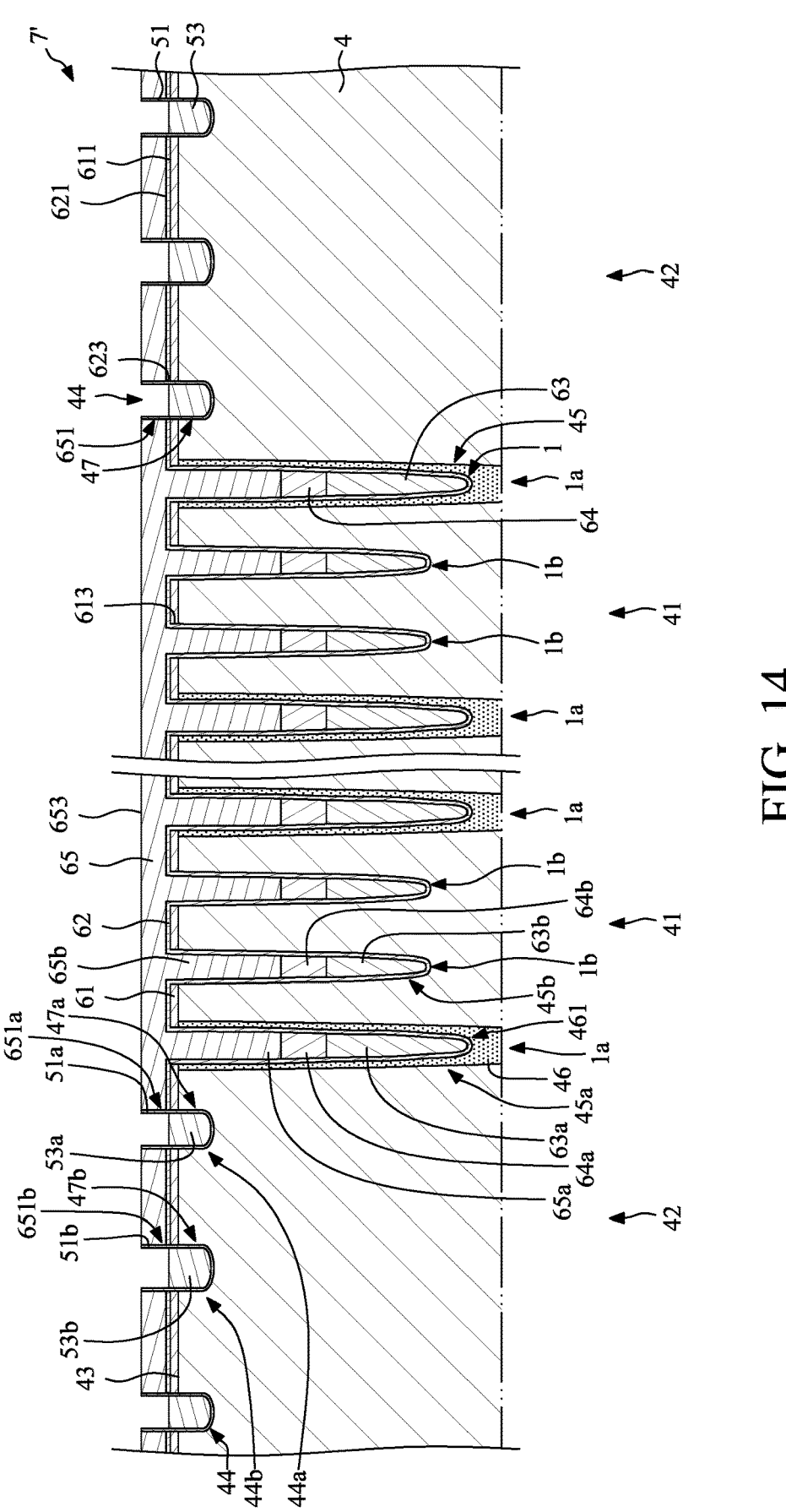
FIG. 14 illustrates a cross-sectional view of one or more stages of an example of a method of manufacturing a semiconductor structure according to some embodiments of the present disclosure.

Referring to FIG. 14, the portion of the polysilicon layer 53 that is disposed on the first surface 653 of the word line nitride layer 65 (i.e., on the first surface 43 (e.g., the top surface) of the substrate 4) may be removed by, for example, etching. In some embodiments, an upper portion of the polysilicon layer 53 that is disposed in the outer trench 44 may be also removed. Thus, a top surface of the polysilicon layer 53 may be lower than the first surface 653 (e.g., the top surface) of the word line nitride layer 65. In some embodiments, the top surface of the polysilicon layer 53 may be lower than the first surface 621 (e.g., the top surface) of the isolation layer 62. The top surface of the polysilicon layer 53 may be higher than the first surface 43 (e.g., the top surface) of the substrate 4. The top surface of the polysilicon layer 53 may be higher than the first surface 611 (e.g., the top surface) of the cover layer 61.

Meanwhile, the polysilicon layer 53 may include a first polysilicon layer 53*a* and a second polysilicon layer 53*b* spaced apart from each other. The first polysilicon layer 53*a* may be disposed on the first insulation layer 51*a* in the first recess 47*a* of the periphery portion 42 of the substrate 4. Thus, the first insulation layer 51*a* may be disposed between the first polysilicon layer 53*a* and the periphery portion 42 of the substrate 4. The second polysilicon layer 53*b* may be disposed on the second insulation layer 51*b* in the second recess 47*b* of the periphery portion 42 of the substrate 4. Thus, the second insulation layer 51*b* may be disposed between the second polysilicon layer 53*b* and the periphery portion 42 of the substrate 4.

Figure 15:
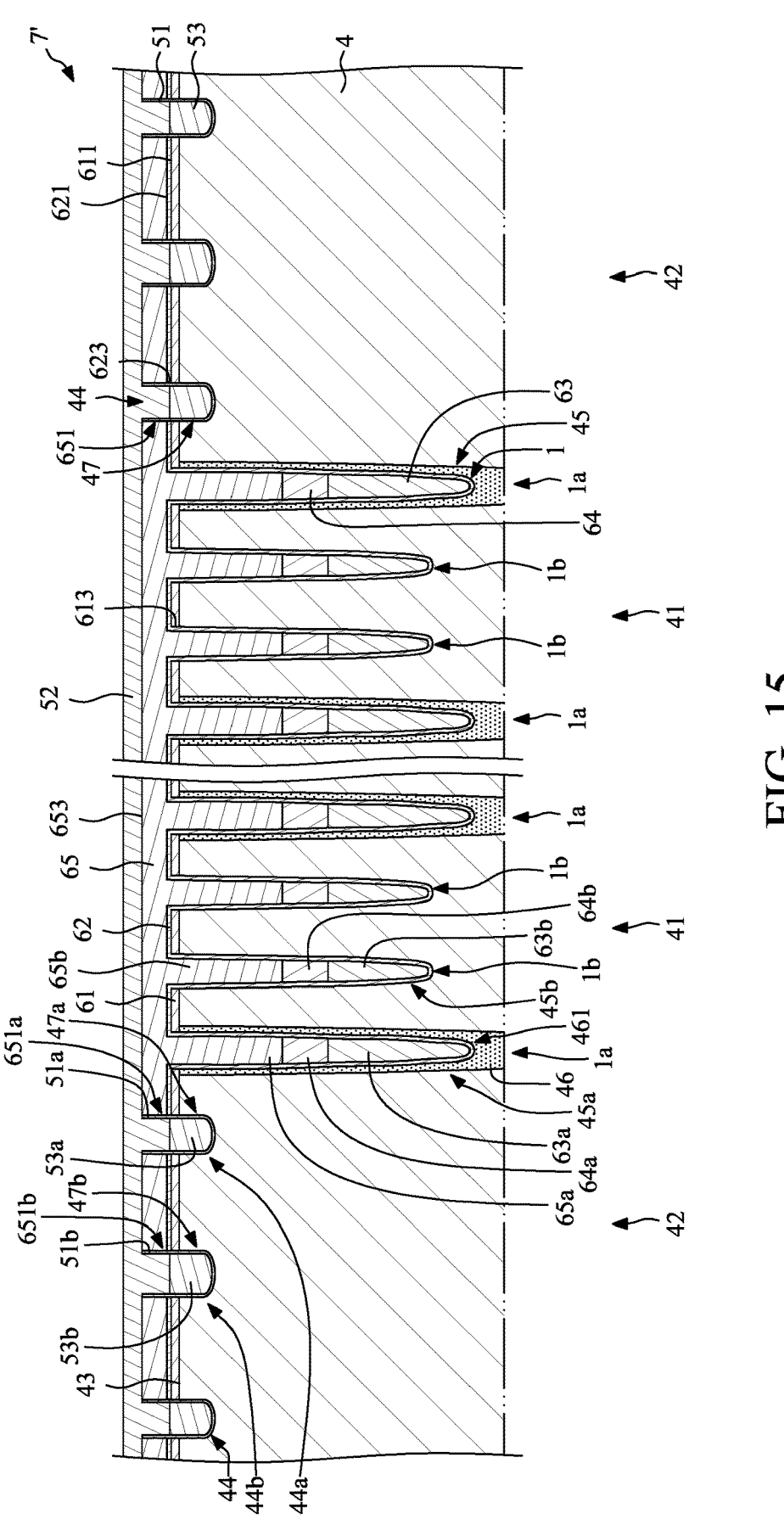
FIG. 15 illustrates a cross-sectional view of one or more stages of an example of a method of manufacturing a semiconductor structure according to some embodiments of the present disclosure.

Referring to FIG. 15, a gate conductor 52 may be formed or disposed on the first surface 653 of the word line nitride layer 65 (i.e., on the first surface 43 (e.g., the top surface) of the substrate 4) and may fill in the outer trench 44 by, for example, deposition. Thus, the gate conductor 52 may be formed or disposed on the polysilicon layer 53 in the outer trench 44 and in the recess 47 of the periphery portion 42.

Referring to FIG. 1, the portion of the gate conductor 52 that is disposed on the first surface 653 of the word line nitride layer 65 (i.e., on the first surface 43 (e.g., the top surface) of the substrate 4) may be removed by, for example, etching. In some embodiments, an upper portion of the gate conductor 52 that is disposed in the outer trench 44 may be also removed. Thus, a first surface 521 (e.g., a top surface) of the gate conductor 52 may be lower than the first surface 653 (e.g., the top surface) of the word line nitride layer 65. In some embodiments, the first surface 521 (e.g., a top surface) of the gate conductor 52 may be higher than the first surface 621 (e.g., the top surface) of the isolation layer 62. In addition, a bottom surface 522 of the gate conductor 52 may be higher than the first surface 43 (e.g., the top surface) of the substrate 4. In some embodiments, the bottom surface 522 of the gate conductor 52 may be higher than the first surface 611 (e.g., the top surface) of the cover layer 61. The bottom surface 522 of the gate conductor 52 may be lower than the first surface 621 (e.g., the top surface) of the isolation layer 62. The insulation layer 51, the polysilicon layer 53 and the gate conductor 52 may collectively form a recess transistor 5 disposed in an outer trench 44.

Meanwhile, the gate conductor 52 may include a first gate conductor 52*a* and a second gate conductor 52*b* spaced apart from each other. The first gate conductor 52*a* may be disposed on the first polysilicon layer 53*a* and the first insulation layer 51*a*. Thus, the first gate conductor 52*a* may be disposed in the first opening 651*a* of the word line nitride layer 65. The first insulation layer 51*a* may be disposed between the first gate conductor 52*a* and the word line nitride layer 65. The first insulation layer 51*a*, the first polysilicon layer 53*a* and the first gate conductor 52*a* may collectively form a first recess transistor 5*a*. The first recess transistor 5*a* may be disposed in the first outer trench 44*a*.

The second gate conductor 52*b* may be disposed on the second polysilicon layer 53*b* and the second insulation layer 51*b*. Thus, the second gate conductor 52*b* may be disposed in the second opening 651*b* of the word line nitride layer 65. The second insulation layer 51*b* may be disposed between the second gate conductor 52*b* and the word line nitride layer 65. The second insulation layer 51*b*, the second polysilicon layer 53*b* and the second gate conductor 52*b* may collectively form a second recess transistor 5*b*. The second recess transistor 5*b* may be disposed in the second outer trench 44*b*.

Therefore, a semiconductor structure 7 shown in FIG. 1 is obtained.

Figure 16:
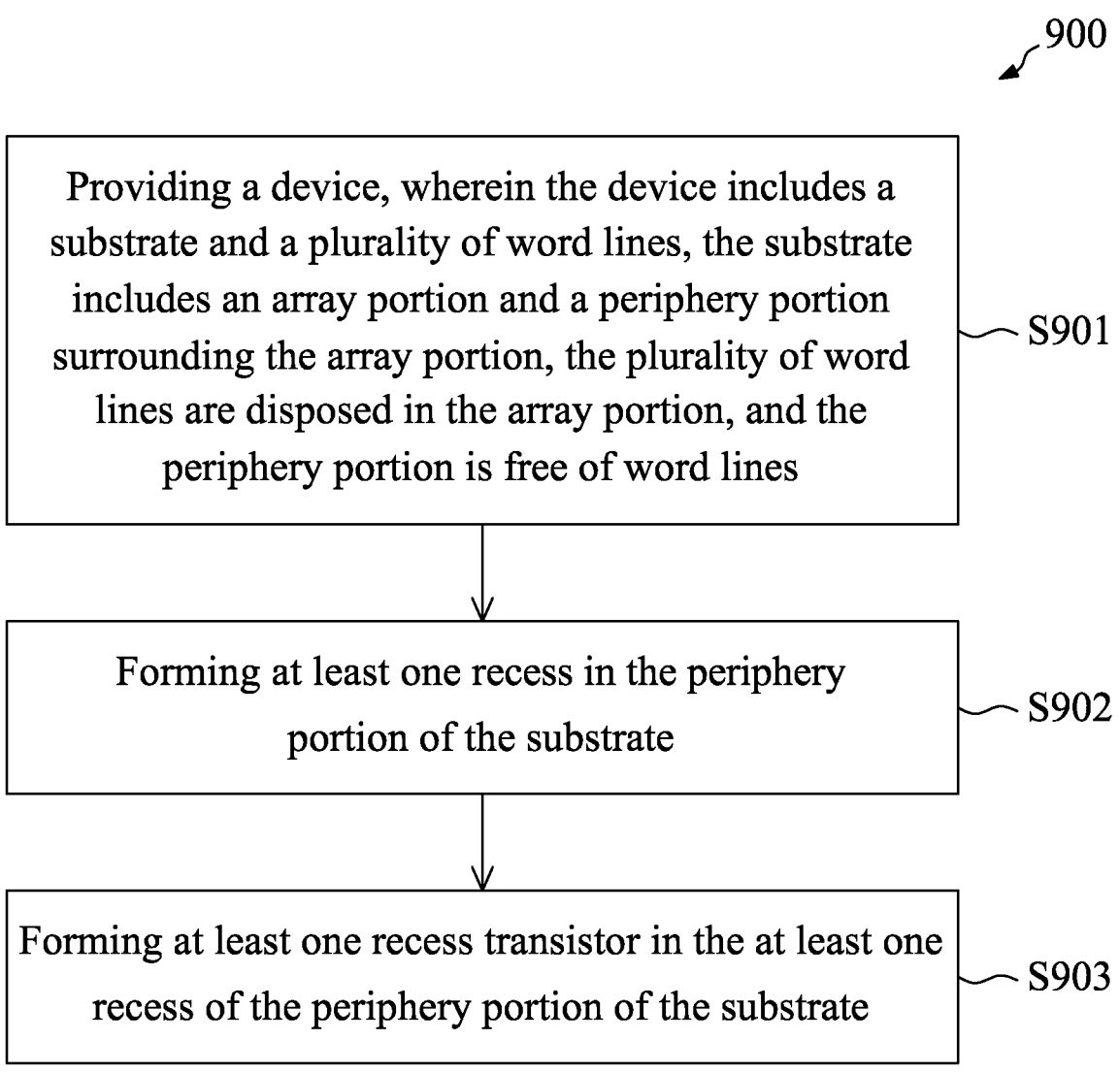
FIG. 16 illustrates a flow chart of a method of manufacturing a semiconductor structure according to some embodiments of the present disclosure.

FIG. 16 illustrates a flow chart of a method 900 of manufacturing a semiconductor structure according to some embodiments of the present disclosure.

In some embodiments, the method 900 can include a step S901, providing a device, wherein the device includes a substrate and a plurality of word lines, the substrate includes an array portion and a periphery portion surrounding the array portion, the plurality of word lines are disposed in the array portion, and the periphery portion is free of word lines. For example, as shown in FIG. 3, a device 7' is provided. The device 7' includes a substrate 4 and a plurality of word lines 1. The substrate 4 includes an array portion 41 and a periphery portion 42 surrounding the array portion 41. The plurality of word lines 1 are disposed in the array portion 41. The periphery portion 42 is free of word lines.

In some embodiments, the method 900 can include a step S902, forming at least one recess in the periphery portion of the substrate. For example, as shown in FIG. 11, the at least one recess 47 is formed in the periphery portion 42 of the substrate 4.

In some embodiments, the method 900 can include a step S903, forming at least one recess transistor in the at least one recess of the periphery portion of the substrate. For example, as shown in FIG. 1, at least one recess transistor 5 is formed in the at least one recess 47 of the periphery portion 42 of the substrate 4.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
   providing a device, wherein the device includes a substrate and a plurality of word lines and a word line nitride layer, wherein the word line nitride layer covers a top surface of the substrate and extends into the plurality of word lines;

forming at least one outer trench extending through the word line nitride layer and extending into the substrate to form an opening through the word line nitride layer and above the substrate; and forming at least one recess transistor in the at least one outer trench, wherein the at least one recess transistor comprises a gate conductor disposed in the opening at a position that a top surface of the gate conductor is lower than a top surface of the word line nitride layer.

2. The method of claim 1, wherein forming the at least one outer trench includes:

forming a mask layer on the word line nitride layer;

forming a sacrificial layer on the mask layer, wherein the sacrificial layer includes a plurality of openings to expose portions of the mask layer; and removing portions of the word line nitride layer and portions of the substrate to form the at least one outer trench according to the openings of the sacrificial layer.

3. The method of claim 2, wherein forming the sacrificial layer on the mask layer includes:

forming a patterned photoresist layer on the mask layer, wherein the patterned photoresist layer includes a plurality of remaining portions spaced apart from each other;

forming the sacrificial layer on the mask layer to cover the plurality of remaining portions of the patterned photoresist layer; and removing the plurality of remaining portions of the patterned photoresist layer to form the plurality of openings of the sacrificial layer.

4. The method of claim 3, wherein in the step of forming the sacrificial layer on the mask layer to cover the plurality of remaining portions of the patterned photoresist layer, the sacrificial layer covers a plurality of top surfaces of the plurality of remaining portions of the patterned photoresist layer, and the method further comprises:

thinning the sacrificial layer to expose the plurality of top surfaces of the plurality of remaining portions of the patterned photoresist layer.

5. The method of claim 4, wherein after the step of thinning the sacrificial layer, a top surface of the sacrificial layer is substantially coplanar with the plurality of top surfaces of the plurality of remaining portions of the patterned photoresist layer.

6. The method of claim 1, wherein forming the at least one recess transistor in the at least one outer trench includes:

forming an insulation layer on a sidewall of the at least one outer trench; and forming a polysilicon layer on the insulation layer in the at least one outer trench wherein the gate conductor is disposed on the polysilicon layer.

7. The method of claim 6, wherein in the step of forming the polysilicon layer on the insulation layer, the polysilicon layer further covers the top surface of the word line nitride layer, and the method further comprises:

removing a portion of the polysilicon layer on the top surface of the word line nitride layer.

* * * * *